United States Patent
Greenwood

(10) Patent No.: US 12,397,269 B2
(45) Date of Patent: Aug. 26, 2025

(54) FLAMMABLE GAS DILUTER AND METHOD THEREFORE

(71) Applicant: Edwards Limited, Burgess Hill (GB)

(72) Inventor: Joanne Rachel Greenwood, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 514 days.

(21) Appl. No.: 18/001,354

(22) PCT Filed: Jun. 7, 2021

(86) PCT No.: PCT/GB2021/051406
§ 371 (c)(1),
(2) Date: Dec. 9, 2022

(87) PCT Pub. No.: WO2021/250384
PCT Pub. Date: Dec. 16, 2021

(65) Prior Publication Data
US 2023/0234004 A1 Jul. 27, 2023

(30) Foreign Application Priority Data
Jun. 12, 2020 (GB) ..................................... 2009009

(51) Int. Cl.
*B01F 23/00* (2022.01)
*B01F 23/10* (2022.01)
(Continued)

(52) U.S. Cl.
CPC ........ *B01F 23/191* (2022.01); *B01F 25/3141* (2022.01); *B01F 25/31424* (2022.01);
(Continued)

(58) Field of Classification Search
CPC B01F 23/191; B01F 25/4317; B01F 35/2209; B01F 25/31424; B01F 25/3141; G03F 7/70841
See application file for complete search history.

(56) References Cited

U.S. PATENT DOCUMENTS

| 5,353,829 A | 10/1994 | Shiban |
| 8,650,973 B2 * | 2/2014 | Wei .................. G01N 1/2252 73/863.03 |

(Continued)

FOREIGN PATENT DOCUMENTS

| CN | 100591411 C | 2/2010 |
| GB | 2561899 A | 10/2018 |

(Continued)

OTHER PUBLICATIONS

Taiwanese Office Action dated Aug. 26, 2024 and Search Report dated Aug. 20, 2024 for corresponding Taiwanese application Serial No. 110121341, 7 pages.

(Continued)

*Primary Examiner* — Anshu Bhatia
(74) *Attorney, Agent, or Firm* — Theodore M. Magee; Westman, Champlin & Koehler, P.A.

(57) ABSTRACT

A flammable gas diluter includes a dilution vessel having an outer envelope defining a longitudinal flow passage from an inlet to an outlet; at least one air inlet assembly for directing a flow of air into the inlet of the dilution vessel; a flammable gas inlet arrangement located towards an inlet end of the dilution vessel; two gas flow generators configured to pump a flow of air into the air inlet assembly, the two gas flow generators being located upstream of the flammable gas inlet arrangement; and two dampers, each of the dampers being mounted between a corresponding gas flow generator and the dilution vessel. Control circuitry is configured to open a damper during an operational mode of the corresponding gas (Continued)

flow generator and to close the damper when the corresponding gas flow generator is stopped in standby mode.

11 Claims, 9 Drawing Sheets

(51) Int. Cl.
      *B01F 25/314*       (2022.01)
      *B01F 25/431*       (2022.01)
      *B01F 35/22*       (2022.01)
      *G03F 7/00*       (2006.01)

(52) U.S. Cl.
    CPC ...... *B01F 25/4312* (2022.01); *B01F 25/4317* (2022.01); *B01F 25/431952* (2022.01); *B01F 35/2209* (2022.01); *G03F 7/70841* (2013.01)

(56) References Cited

U.S. PATENT DOCUMENTS

| | | | |
|---|---|---|---|
| 2007/0048559 A1 | 3/2007 | Beasley | |
| 2008/0273995 A1* | 11/2008 | Bailey | F04D 27/0292 |
| | | | 417/279 |
| 2017/0370490 A1 | 12/2017 | Caires Fernandez | |
| 2020/0047225 A1* | 2/2020 | Bailey | F04D 27/0292 |
| 2021/0291127 A1* | 9/2021 | Hishikawa | F23N 1/025 |

FOREIGN PATENT DOCUMENTS

| | | |
|---|---|---|
| JP | 2009224306 A | 10/2009 |
| JP | 2001227783 A | 8/2021 |
| TW | 497987 B | 8/2022 |
| WO | 2006095132 A1 | 9/2006 |

OTHER PUBLICATIONS

Japanese Notification of Reason for Rejection dated Jan. 28, 2025 for corresponding Japanese application Serial No. 2022-575778, 4 pages.

British Examination Report dated Dec. 15, 2020 and Search Report dated Dec. 14, 2020 for corresponding British Application No. GB2009009.8, 5 pages.

PCT Notification of Transmittal of the International Search Report and the Written Opinion of the International Searching Authority, or the Declaration and PCT Search Report dated Sep. 22, 2021 for corresponding PCT application Serial No. PCT/GB2021/051406, 6 pages.

PCT Written Opinion dated Sep. 22, 21 for corresponding PCT application Serial No. PCT/GB2021/051406, 5 pages.

* cited by examiner

FLAMMABLE GAS DILUTER AND METHOD THEREFORE

CROSS-REFERENCE OF RELATED APPLICATION

This application is a Section 371 National Stage Application of International Application No. PCT/GB2021/051406, filed Jun. 7, 2021, and published as WO 2021/250384A1 on Dec. 16, 2021, the content of which is hereby incorporated by reference in its entirety and which claims priority of British Application No. 2009009.8, filed Jun. 12, 2020.

FIELD

The field of the invention relates to flammable gas dilution and in some embodiments to a vacuum pumping and abatement system.

BACKGROUND

There are semiconductor fabrication processes where the gas to be exhausted and abated is a flammable gas such as hydrogen. In lithography for example, the product is manufactured by controlled exposure to a source of radiation. In this case the source of radiation is extreme ultraviolet EUV radiation. In this process hydrogen is used as a curtain gas in increasingly large quantities to shield the optics and mirrors from the sputtered tin that is excited by the laser to radiate EUV light in the lithography tool. These processes are performed within a vacuum and the vacuum system provides the vacuum pressures necessary for this process to occur and carries the hydrogen away to be safely abated.

In many abatement systems the flammable gas that is removed from the vacuum process chamber is burned to remove the gas. There are environmental implications associated with this and it generally requires two abatement tools, an operational one and a backup one in case the burner in the operational abatement tool is extinguished. This arrangement is expensive in both fuel, and space.

It would be desirable to provide an alternative way of abating flammable gas from a gas stream, so that the gas stream can be safely exhausted.

The discussion above is merely provided for general background information and is not intended to be used as an aid in determining the scope of the claimed subject matter. The claimed subject matter is not limited to implementations that solve any or all disadvantages noted in the background.

SUMMARY

A first aspect provides a flammable gas diluter for diluting a flow of flammable gas to a concentration below the flammability limit of said flammable gas, said diluter comprising: a dilution vessel comprising an outer envelope defining a longitudinal flow passage from an inlet to an outlet; at least one air inlet assembly for directing a flow of air into said inlet of said dilution vessel; a flammable gas inlet arrangement located towards an inlet end of said dilution vessel; two gas flow generators configured to pump a flow of air into said air inlet assembly, said two gas flow generators being located upstream of said flammable gas inlet arrangement; wherein said two gas flow generators are configured to operate as operational and backup gas flow generators, and two dampers, one damper associated with each of said gas flow generators, each of said dampers being mounted between said corresponding gas flow generator and said dilution vessel, said dampers being configured to obscure a passage between said corresponding gas flow generator and said dilution vessel when closed and to open said passage between said gas flow generator and said dilution vessel when open; and control circuitry configured to control the opening and closing of said dampers, said control circuitry being configured to open said damper during an operational mode of said corresponding gas flow generator and to close said damper when said corresponding gas flow generator is stopped in standby mode.

Flammable gas is challenging to handle and dispose of. For these reasons flammable gas output by a system has generally been dealt with by burning it in a burner, sometimes using methane as a fuel. This has implications for the environment, is relatively expensive in fuel and space and can have reliability issues. Despite the challenges associated with handling flammable gas, were one able to safely dilute it to below its flammability limit then many flammable gases could simply be vented to atmosphere.

Previously where flammable gases have been diluted this has generally been done with nitrogen which is an inert gas and at pressures above atmosphere. However, in systems where the amount of flammable gas is high, the amount of nitrogen that would be required to reduce the concentration of the flammable gas to below the flammable gas flammability level is in many cases prohibitively expensive. Furthermore, operating at higher pressures has its own challenges.

The dilution of flammable gas would seem to be an acceptable alternative to burning flammable gas as a means of abatement provided that one could do so safely and reliably. Were the concentration of flammable gas to rise not only does this have safety implications but also the system from which the flammable gas is produced may need to be shut down and this can be expensive.

Embodiments address these issues with a flammable gas diluter that has a supply of air from at least two gas flow generators each configured to operate in either operational mode or as a backup. Thus, one gas flow generator can be generating the required air flow while the other acts as a backup in standby mode ready to be used were the operational gas flow generator to require servicing.

One potential problem with providing two gas flow generators is that there is a potential leakage path of gas flow via the non-operational gas flow generator out of the dilution system. Not only may this cause pressure fluctuations within the system, which may trigger alarms and the system to shut down, but also flow through the gas flow generator in a direction that is opposite to its operational direction will cause it to contra rotate making it difficult or impossible to start when required. This has been addressed by the provision of dampers associated with each gas flow generator. These dampers are configured to open or obscure a gas flow passage between the gas flow generator and the dilution vessel and are controlled by control circuitry so that they can be automatically opened and closed as required. In this way when not operational the path "backwards" through the non-operational gas flow generator may be at least partially blocked inhibiting gas from leaking from the system and causing contra rotation of the generator.

The dampers may have a number of forms, but in some embodiments comprise slats that form a louvre type arrangement. The slats have a narrow cross section and a wide cross section, the slats being rotationally mounted such that the wide cross sections lie parallel to and across the gas passage cross section in the closed position and the wide cross section lies perpendicular to the passage cross section in the open position, such that in this orientation it is only the narrow cross section that forms any barrier to the gas passage. When closed the slats may cover over 95% of the area of the cross section.

In some embodiments, said control circuitry is configured in response to a signal indicating that a currently operational gas flow generator is to be stopped and a gas flow generator currently in standby mode is to be started to: control said gas flow generator in standby mode to start and after a predetermined delay to: control said damper associated with said started gas flow generator to open.

When switching between gas flow generators, perhaps where an operational gas flow generator is to swapped out for maintenance, it has been found that in order to inhibit gas leakage through, and potential contra rotation of, the currently non-operational gas flow generator, it is advantageous if this gas flow generator is started prior to opening the damper, and only after a predetermined delay is the damper opened. In this way leakage of gas and corresponding fluctuations in the system are inhibited. Gas leakage backwards through a stopped gas flow generator, not only makes it difficult to start but may result in undesirable pressure fluctuations within the system, and flammable gas concentrations rising either of which might trigger warning signals and the system being diluted to shut down. The signal indicating that the currently operational gas flow generator is to be stopped may be generated in response to signals received from sensors sensing the operational gas flow generator. Where these signals indicate that the gas flow generator has an elevated temperature, or increased vibrations for example, then the control circuitry may generate a signal indicating that the gas flow generator should stop and be replaced by the backup gas flow generator.

The predetermined delay may be the time for the gas flow generator to reach its usual operational speed, or it may be a time for it to reach or exceed a fraction of its usual operational speed, such as more than 70% of the usual operational speed, or in some cases more than 80%. The usual operational speed may be substantially less than the gas flow generator's top speed. The delay may be set as a time, or it may be determined by sensors sensing the gas flow generator to have reached a certain operational speed for example.

In some embodiments, said control circuitry is configured to control said damper associated with said operational gas flow generator to close and to control said operational gas flow generator to stop.

The control circuitry may at or slightly after the opening of the damper associated with the newly started gas flow generator control the damper of the other gas flow generator to close and it may also control the gas flow generator to stop operating, at or following closure of the associated damper.

In some embodiments, said control circuitry is configured in response to a signal indicating said diluter is to startup to: control said damper associated with said backup gas flow generator to be open and said damper associated with said operational gas flow generator to be closed and to control said backup gas flow generator to start; and after a set test time to control said operational gas flow generator to start; and after a predetermined delay to control said damper associated with said operational gas flow generator to open and said damper associated with said backup gas flow generator to close; and to control said backup gas flow generator to stop operating.

When the system is to be started, it is advantageous prior to starting to ensure that the backup gas flow generator is functional. Thus it may be advantageous to start by operating the backup gas flow generator for a certain test period. During this test period the damper associated with this gas flow generator should be open and the damper associated with the other gas flow generator closed. After a certain test time has expired, then the operational gas flow generator may be started. At this time the damper associated with it is still closed. After a predetermined delay, the damper is opened and the damper associated with the backup gas flow generator is closed and the backup flow generator is turned off. The closing of the damper associated with the backup gas flow generator may be at substantially the same time as the opening of the damper of the operational gas flow generator or it may be slightly after it. In this regard having both gas flow generators operational and both dampers open is not a problem. Having one gas flow generator not operational and its damper open is what leads to gas leakage and contra rotation.

In some embodiments, said flammable gas inlet arrangement comprises a plurality of apertures at least some being arranged at different distances from said outer envelope of said dilution vessel across a cross section of said dilution vessel towards said inlet end of said dilution vessel; a plurality of gas flow directing formations arranged between said flammable gas inlet arrangement and said outlet, each being at a different position along a length of said dilution vessel; wherein at least one of said plurality of gas flow formations is an inwardly directing gas flow formation for directing gas flow away from said outer envelope and at least one of said gas flow formations is an outwardly directing gas flow formation for directing gas flow towards said outer envelope.

It may be advantageous for the diluter to have simple design with few moving parts as this allows the diluter to be both robust, reliable and unlikely to fail. This can be very important in a system where the failure of an abatement unit may cause the flammable gas to shut off to the system which in turn may require the system to be shut down immediately which can result in damage to the system.

The dilution of flammable gas would seem to be an acceptable alternative to burning flammable gas as a means of abatement provided that one could do so safely. The inventors of the present invention recognised that many of the hazards associated with handling flammable gases are associated with transporting the flammable gas from the point of use to a point where it can be safely abated. Thus, many of the challenges can be addressed by providing a diluter that is simple in design, relatively compact and has few moving parts, allowing it to be used as a point of use diluter to dilute flammable gas at a point at or close to where it has been used.

In some embodiments, said dilution vessel comprises a constricted portion, said flammable gas inlet arrangement being located within said constricted portion such that said air is accelerated prior to passing said flammable gas inlet.

When the flammable gas is input to the diluter it may initially be above its upper flammability limit, but on dilution it will become flammable until it is diluted to below its lower flammability limit and thus, steps need to be taken to mitigate any risk of ignition between these points. Increasing the air flow at the flammable gas inlet by using a constriction, is one way of diluting the gas relatively quickly initially and inhibiting ignition particularly if the increased flow rate is above the flame speed for the flammable gas.

In some embodiments the diluter is configured to dilute the flammable gas to below a fraction of its lower flammability limit, in some cases to below a half and in some to below a quarter aa the outlet of the system. For safety reasons and to provide a robust system it may be advantageous for the system to seek to dilute the gas to a fraction of the lower flammability limit and for sensors to trigger warnings when this fraction of the lower flammability limit is exceeded at the outlet.

The constriction may only extend for a fraction of the length of the dilution vessel, the dilution vessel expanding out beyond the constricted portion such that the gas flow slows. This helps mixing between the flammable gas and air within a constrained space.

In some embodiments, the flammable gas diluter comprises at least one gas flow generator for pumping a flow of air into said air inlet assembly of said flammable gas diluter, said at least one gas flow generator being located upstream of said flammable gas inlet arrangement.

As noted above the concentration of flammable gas within the diluter is between the upper and lower flammability limits for a portion of the length of the diluter downstream of the flammable gas inlet. Thus, it is advantageous for any potential sources of ignition to be absent for this portion of the diluter and the diluter is configured such that any moving parts such as exist in a gas flow generator, which may be in the form of a fan, are upstream of the flammable gas inlet, so that there are no moving parts which might be potential causes of ignition downstream of the flammable gas inlet.

In some embodiments, the flammable gas diluter comprises two gas flow generators configured to operate as operational and backup gas flow generators.

In many systems where flammable gasses need to be removed and abated it is important that the concentration of flammable gas does not rise above a certain level and thus, it is important particularly where the flammable gas is being diluted at the point of use that the system is reliable and does not fail. Thus, in some embodiments two gas flow generators are provided, one configured to operate as the primary gas flow generator and the other as a backup gas flow generator that functions were the primary gas flow generator to have a fault. As the diluter is a simple design with few moving parts, a reliable system can be provided where the components that do have moving parts, in this case the gas flow generators are duplicated.

In some embodiments, said air inlet assembly comprises a conduit directing air to said inlet of said dilution vessel, said two gas flow generators being located at substantially a same longitudinal position on said conduit, in some embodiments at different positions around a perimeter of said gas conduit.

In some embodiments the two gas flow generators may be located at different longitudinal positions along the conduit in a vertical arrangement, one on top of the other. In other embodiments they may be located on either side of the conduit which reduces the height of the diluter and makes it more compact. Where they are located on either side of the conduit, one of the gas flow generators, may be rotationally offset with respect to the other such that the air inlets of the two gas flow generators do not directly face each other.

In some embodiments, said at least one gas flow generator and dilution vessel are configured such that a speed of flow of said air at said flammable gas inlet arrangement is greater than a flame speed of flammable gas.

As noted previously, it is important to impede ignition of the flammable gas when it is within the diluter particularly close to the inlet of the flammable gas where the concentrations of flammable gas will be highest. Thus, providing the air at the flammable gas inlet arrangement at a speed that is greater than a flame speed of the flammable gas will impede its ignition. In this regard, the flame speed of hydrogen for example is between 3 to 4 meters per second such that a hydrogen diluter should be configured so that the air speed at the hydrogen gas inlet is greater than 3 to 4 meters per second. In some embodiments it is configured to be greater than 20 meters per second, preferably greater than 25 or 30 meters per second.

In some embodiments, in addition to providing this accelerated flow of air there may also be a flame arrester cone at the flammable gas inlet.

In some embodiments, said flammable gas inlet arrangement is configured such that said apertures are facing away from said gas outlet.

It has been found that improved mixing of the flammable gas with the air occurs where the apertures are facing away from the gas outlet and in some embodiments facing towards the gas inlet.

In some embodiments, said apertures of said flammable gas inlet arrangement are between 2 and 5 mm in diameter.

The choice of size of the flammable gas apertures affects the flow of flammable gas into the diluter, this is particularly so where the apertures are facing towards the diluting air flow. Too large an aperture and the air flow will impede exit of the flammable gas and may indeed cause contamination with air flowing into the vacuum system while too small an aperture will inhibit the gas flow. An aperture size of between 2 and 5 mm diameter has been found to provide particularly effective flow of flammable gas into the diluter.

In some embodiments, said flammable gas inlet arrangement comprises an outer ring channel and radial channels running from said outer ring channel towards a centre of said ring, said radial channels comprising said apertures.

In order to provide the flow of flammable gas into the air flow in a way that encourages mixing between the two gas flows, it has been found to be advantageous to provide the apertures in the inlet arrangement at different radial positions across the gas flow such that there is not a single plume that is formed but rather several flows of flammable gas from different apertures at different radial positions. The use of arms across the cross section of the diluter has also been found to provide an effective arrangement where the air flow is not unduly inhibited and thus, the vacuum pumps are not over pressured. The collar or outer ring channel surrounding the diffuser where the hydrogen is introduced from the pumping system into the diffuser, is sized to permit substantially equal and unrestricted flow to the spider arms around the inner circumference. In some embodiments, the spider comprises between 4 and 8 arms across the diffuser or diluter inlet. The spider arms are sized so as not to restrict the diffuser air flow path by more than 30%. The apertures in the spider arms are distributed substantially evenly along the length of the arms and arranged to face the flow of diluting gas, in some embodiments.

Although the outer ring channel may be within the dilution vessel, in some embodiments the outer ring is around the outside envelope of the dilution channel and the radial channels run within radial arms that extend from the inner surface of the envelope, the channels running through the dilution vessel wall to be in fluid communication with the outer ring channel.

Although, the flammable gas diluter is suitable for diluting a variety of flammable gasses, it is particularly suitable for hydrogen. Hydrogen is a very light gas that makes it difficult to pump effectively. It is also prone to accumulate towards the top of any system if flow rate is low. Thus, there are challenges with abating hydrogen and the diluter of embodiments are particular effective at dealing with these challenges. In particular, owing to the reliability of the system with few moving parts, the flow rate is generally maintained at a relatively constant value and the hydrogen will diffuse effectively through the multiple apertures. Furthermore, hydrogen is present in the atmosphere and thus can be vented to the atmosphere when dilute enough. Generally, the flammability limit for hydrogen is a concentration of 4% and thus, below 4% the hydrogen should be safe from ignition. However, to provide a robustly safe system generally a dilution level of 1% at the outlet is the limit that is set.

In some embodiments, said dilution vessel, flammable gas inlet formation and gas directing formations are formed from metal and are earthed.

As noted previously, it may be preferable to remove sources of ignition from the gas flow in the diluter and thus, in some embodiments the flammable gas diluter is formed of a metal that is earthed to reduce any possibility of electrostatic sparks. In some embodiments the metal is stainless steel. In this way, by providing a metallic diluter and having no moving parts within the flammable gas flow and having a flow speed above the speed of the flame of the flammable gas in some embodiments, the chances of any ignition are substantially removed.

Although, the inwardly directed gas flow formations and the outwardly directed gas flow formations may have a number of forms, in some embodiments, said inwardly directing gas flow formation comprises a ring-like baffle projecting in from said outer envelope and said outwardly directing gas flow formation comprises a centrally located cone shaped baffle an apex of said cone facing said inlet of said dilution vessel.

These gas flow formations that direct the gas towards the centre and then away from the centre of the gas flow passage through the dilution vessel provide effective mixing of the gasses and thus, effective dilution of the flammable gas within a relatively small volume. This leads to a compact dilution vessel which is convenient to use as a point of use abatement system.

In some embodiments, said plurality of inwardly and outwardly directing gas flow formations are arranged alternatively along a length of said dilution vessel. Thus, an inwardly directing gas flow formation is followed by an outwardly directing gas flow formation.

In some embodiments, said dilution vessel comprises a volume of less than 70 litres, said flammable gas diluter being configured to dilute a flow of flammable gas of up to 1000 SLM (standard litres per minute).

The diluter of embodiments is, due to its design, compact and able to dilute a relatively high flow of flammable gas within a relatively small volume. Thus, a 70 litre diluter, in some cases a 50 litre diluter may dilute a flow of flammable gas of up to 1000 SLM.

In some embodiments, said flammable gas diluter comprises a flammable gas sampler adjacent to said outlet, said flammable gas sampler being in fluid communication with a flammable gas sensor, said flammable gas diluter further comprising control circuitry for inhibiting a flow of flammable gas to said diluter in response to said flammable gas sensor indicating a concentration of flammable gas above a predetermined level.

In some embodiments, said flammable gas sampler comprising an outer ring channel and radial channels running from said outer ring channel towards a centre of said ring, said radial channels comprising apertures.

In order to ensure the safety of the system the concentration of the gas output from the diluter should be below the flammable limit for that gas and thus, in some embodiments there is a sampler close to the output to ensure that this is the case. Were the concentration to rise above the desired flammable concentration limit then hard wired safety control circuitry will inhibit the flow of flammable gas to the diluter. In this regard, where it is a point of use diluter this may involve closing down the tool to which it is attached and which is generating the hydrogen flow.

In some embodiments, said gas flow generator is configured to supply air at atmospheric pressure to said flammable gas diluter.

A second aspect provides a vacuum pumping system for evacuating at least one vacuum chamber in a semiconductor processing tool, said vacuum pumping system comprising: a plurality of vacuum pumps for evacuating said at least one vacuum chamber; and an abatement system for receiving an exhaust from at least one of said at least one vacuum chamber, wherein said abatement system comprises a flammable gas diluter according to a first aspect.

The diluter of the first aspect provides an effective abatement system which can be provided as an integrated system with a vacuum pumping system for evacuating chambers in a semiconductor processing tool that exhausts a flammable exhaust gas. In this way, there is point of use abatement of the flammable gas and there is no requirement to pipe it elsewhere or to burn it in an abatement system with the drawbacks that such burner abatement systems have.

In some embodiments, said semiconductor processing tool comprises an extreme ultraviolet lithography tool and said flammable gas comprises hydrogen.

Extreme ultraviolet lithography is a technique which uses increasing amounts of hydrogen and thus, an abatement system which provides effective dilution of this hydrogen and can safely dilute it at the point of use without the requirement to pipe it elsewhere or to burn it is a particularly efficient way of evacuating and abating such a system.

In some embodiments, the vacuum pumping system further comprises a housing for housing said plurality of pumps; an air flow duct for receiving air from said housing; said air flow duct being in fluid communication with said at least one air inlet assembly for supplying said air to said flammable gas diluter, such that air flows through said housing, along said air duct and into said diluter in response to operation of at least one of said gas flow generators.

An air flow is required for dilution of the flammable gas and in some cases there may be a cabinet extract flow, that is a flow of air that is passed over the pumps that are evacuating the system to remove any gasses that might potentially be leaking from the pumps which leakage may be problematic, particularly where they are flammable gasses. Thus, there is already a flow of air in place in many processing systems that pump flammable gasses and this flow of air may be directed directly to the diluter thereby saving in both ducting and air flow generators. This provides an efficient way of re-using the air flow through the housing of the pumping system to dilute the hydrogen that is evacuated from the chamber.

A third aspect provides a method of controlling the operation of two gas flow generators for supplying a gas flow to a flammable gas diluter according to any preceding claim, said method comprising: controlling a first one of said two gas flow generators currently in standby mode to start, while keeping said damper between said first gas flow generator and said dilution vessel in a closed position; after a predetermined delay: controlling said damper associated with said first gas flow generator to open.

When a gas flow generator currently in standby mode and isolated from the system via the damper is to start it is advantageous to start it prior to opening the damper as opening the damper while the air flow generator is not operational would provide a leakage path from the diluter to the outside via the non-operational gas flow generator. This may cause disruption in flow within the dilution and may trigger alarms and cause it to shut down.

In some embodiments, said method further comprises: controlling said damper associated with said second gas flow generator to be stopped to close after said predetermined delay; and controlling said second gas flow generator to stop.

In some embodiments, said method comprises in response to a signal indicating said diluter is to startup: controlling said damper associated with said backup gas flow generator to be open and said damper associated with said operational gas flow generator to be closed; controlling said backup gas flow generator to start; and after a set test time controlling said operational gas flow generator to start; and after a predetermined delay controlling said damper associated with said operational gas flow generator to open; controlling said damper associated with said backup gas flow generator to close; and controlling said backup gas flow generator to stop operating.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

The Summary is provided to introduce a selection of concepts in a simplified form that are further described in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

Embodiments of the present invention will now be described further, with reference to the accompanying drawings, in which.

DETAILED DESCRIPTION

Before discussing the embodiments in any more detail, first an overview will be provided.

Dilution is an acceptable option for discharging many flammable gases from a system such as for discharging hydrogen from an EUV tool. Conventionally dilution of a flammable gas has been done using inert gases, however, with increased hydrogen flow, dilution with an inert gas is not acceptable because of the high flow rate required and the added risks and environmental damage that it brings.

Dilution with air provides a cost effective and environmentally friendly alternative.

Basic Theory

Initially the flammable gas from the system such as hydrogen from the EUV contains little or no oxygen and is therefore above the UFL (upper flammable limit) which for hydrogen is 75% hydrogen by volume.

Embodiments seek to dilute to below the lower flammable limit LFL (4% hydrogen by volume). In order to pass from above the UFL where it is safe to below the LFL where it is also safe the mixture must pass through the flammable range (75% to 4% hydrogen by volume). Ignition of the flammable mixture will cause deflagration/detonation. The risk scales with the volume of flammable gas (hydrogen) and the size and lengths of the ducts used to transport the gas.

Hydrogen Characteristics

MIE (minimum ignition energy) for $H_2$ is 17 µJ

Compared to

Gasoline 800 µJ

Methane 300 µJ

Flame speed for $H_2$ in air is 2.88 m/s

Compared to

Gasoline~0.2-0.5 m/s

Methane 0.356 m/s

Provided that the air velocity at the point of $H_2$ introduction >>flame speed of $H_2$ (30 m/s) back flash risk is avoided or at least reduced.

Hydrogen gas is highly diffusive and highly buoyant; it rapidly mixes with air.

Risks

It is very easy to ignite a hydrogen mixture.

Once ignited the flame will travel very fast.

In order to mitigate these risks it would be advantageous for dilution with air to be achieved at the earliest opportunity close to the point of use. This reduces the range of locations in which a flammable mixture could be ignited, and reduces the risk of detonation in pipelines and provides a design that can be tested, certified and replicated in any location without needing to analyse the pipe routing and environment every time.

System

Embodiments of the dilution unit seek to dilute the flammable gas to below its lower flammable limit, in some cases to below a quarter of its lower flammable limit and to manage the flammable zone where the flammable gas is between its LFL and UFL so that potential ignition sources are eliminated or at least reduced.

In some embodiments the system utilises the cabinet extract air as the diluent to reduce the need for additional fans for extracting the air from the pumping system cabinets.

Figure 1:
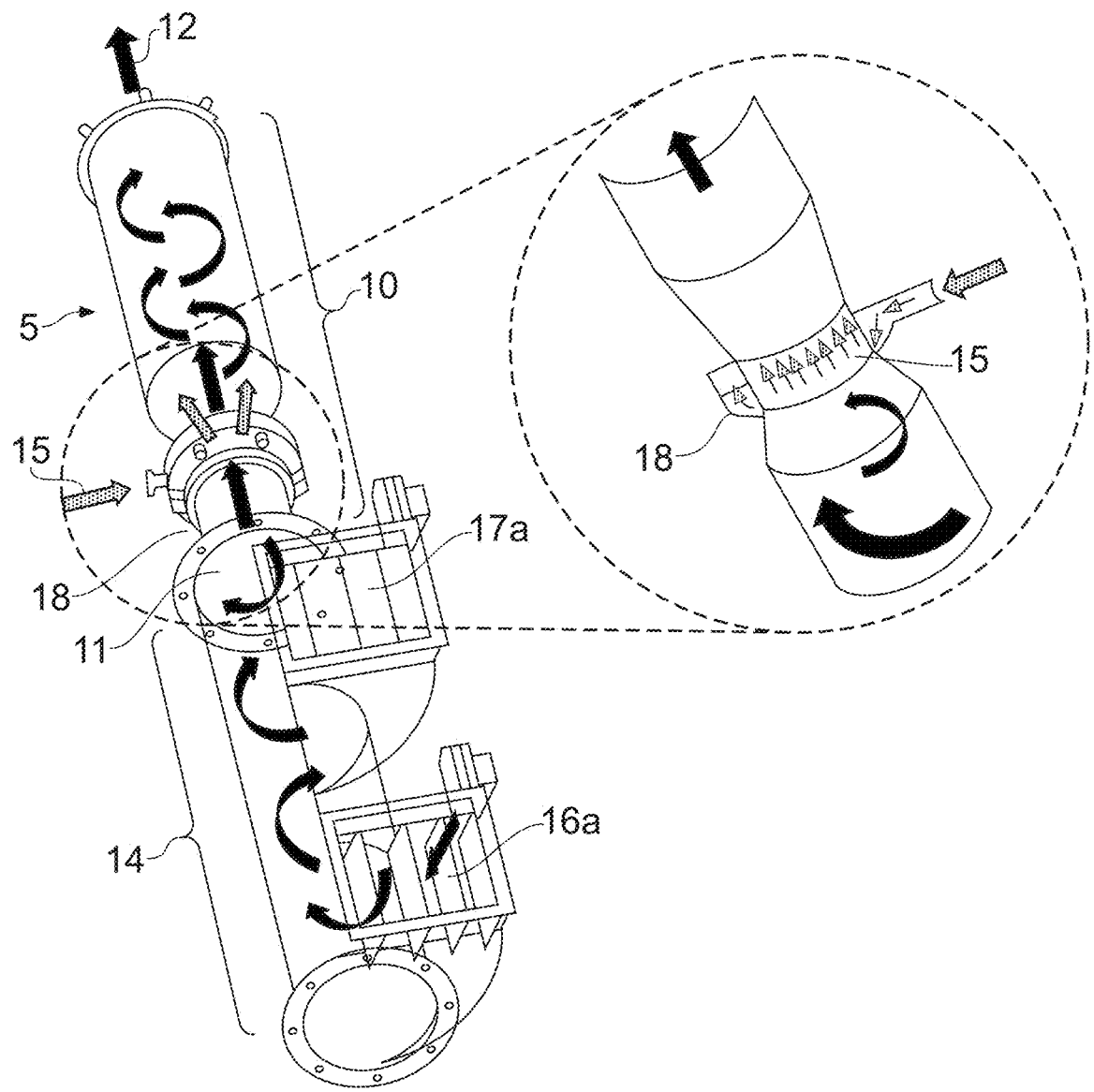
FIG. 1 shows a flammable gas diluter according to an embodiment.

FIG. 1 shows a diluter 5 according to an embodiment. Diluter 5 comprises dilution vessel 10 which runs from inlet 11 to outlet 12. Inlet 11 is connected to an air provision portion 14 comprising two air inlets 16 and 17. These are configured to receive air from a primary fan in the case of air inlet 16 and a backup fan in the case of air inlet 17. Each of the air inlets has a damper 16a, 17a associated with it. The damper comprises slats that rotate between an open position in the case of damper 16a, where primary fan is operational, and a closed position in the case of damper 17a where the secondary fan is in standby mode. The closed damper 17a inhibits leakage of air from air provision portion 14 out through the secondary fan. The dampers are controlled by control circuitry (not shown) such that they open and close automatically depending on the operational state of the diluter. The air from the air inlet is sent along the pipe in the air provision unit 14 to the air inlet 11 of the dilution unit. The dilution unit 10 has a constricted portion 18 within which a flammable gas inlet arrangement 15 is provided. Thus, the air when it reaches the constricted portion is accelerated and thus, passes the flammable gas inlet formation at an increased speed and at a speed that is greater than the flame speed of the flammable gas. The dilution unit 10 then expands to a larger diameter and the gasses slow which improves mixing.

The gasses then flow past various gas directing formations to direct them either towards or away from the outer envelope to improve mixing of the flammable gas with the air such that by the time the gasses reach the outlet 12 they are mixed sufficiently that they have a uniform concentration of below the lower flammable limit of the flammable gas. In this regard, the flammable gas entering at inlet 15 is generally at a concentration above the upper flammable limit and it passes through concentrations where it is indeed flammable as it passes through the diluter until it reaches a concentration below the lower flammable limit prior to exit at the outlet 12.

Figure 2:
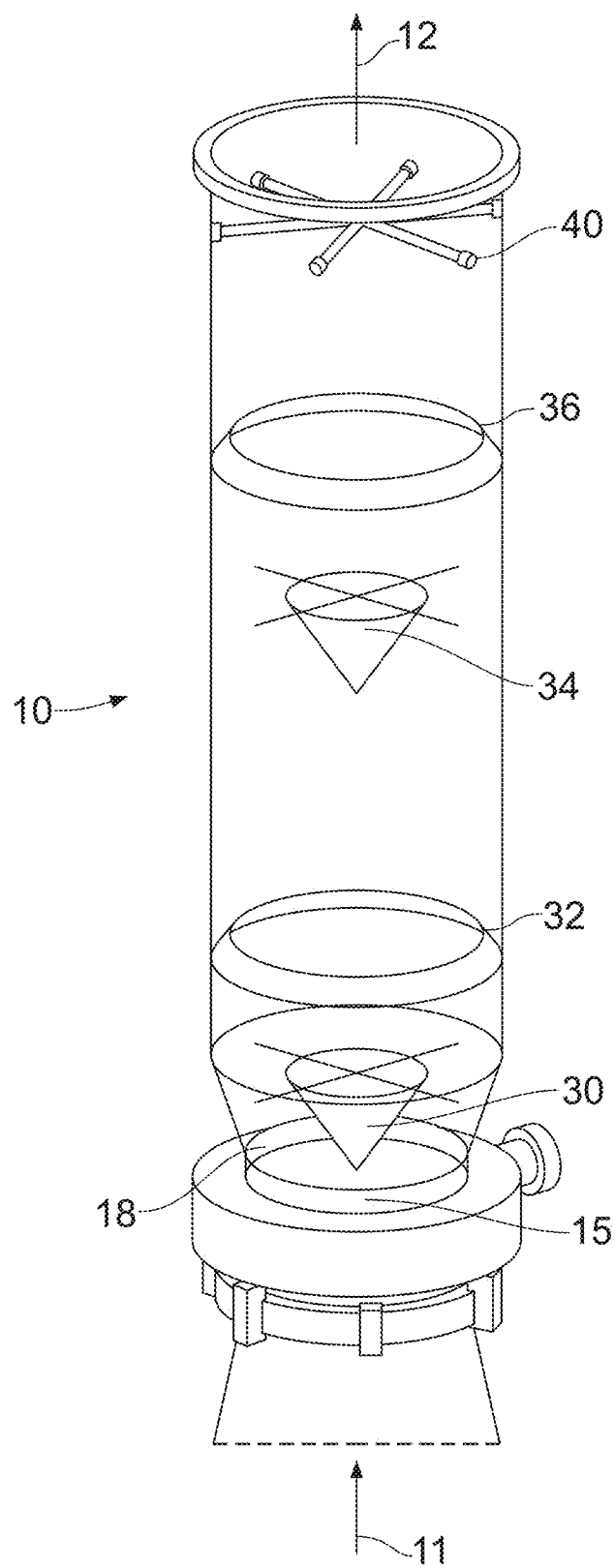
FIG. 2 shows a dilution vessel according to an embodiment.

The dilution vessel 10 and in particular, the gas directing formations for encouraging mixing of the flammable gas and the air are shown in greater detail in FIG. 2. In this embodiment, these gas directing formations take the form of cones 30, 34 for directing flow towards the outer walls and baffles 32, 36 for directing flow towards the middle.

The flammable gas enters the dilution vessel at the constricted portion via an inlet arrangement in the form of inlet spider 15. This takes the form of a collar or ring around the outside of the gas dilution vessel 10 into which the hydrogen gas flows. There are radial arms extending through the walls of the dilution vessel from the outer ring and into the gas flow portion. These extend across the cross-section of the constricted portion and apertures on the arms dispense hydrogen into the air flow. These apertures face towards the air inlet 11 of the gas dilution vessel 10.

The gas directing formations 30, 32, 34, 36 are arranged at different longitudinal positions along the length of the dilution vessel 10 and comprise alternatively a cone for directing flow towards the outer edge of the dilution vessel and a baffle for directing it back towards the middle. Thus, at the lower end close to the air and hydrogen inlets there is a cone 30 that diverts the gas mixture towards the outer walls of the vessel and also acts to slow the flow that has been accelerated by constriction 18. Next on the gas flow path is a baffle 32 to direct the air back towards the centre and this is followed by cone 34 and then by baffle 36. In this embodiment there is a sample spider 40 for sampling the gas prior to the exit. This can be directed to a hydrogen sensor to determine that the concentration of the hydrogen exiting the outlet 12 is below the lower flammable limit for hydrogen. The signal from the hydrogen sensor may in turn be sent to control circuitry which in response to determining that the level of hydrogen concentration is above a predetermined limit will generate a control signal for shutting down the hydrogen supply to the diluter, which may involve shutting down the processing in the vacuum chamber from which the hydrogen is received.

Figure 3:
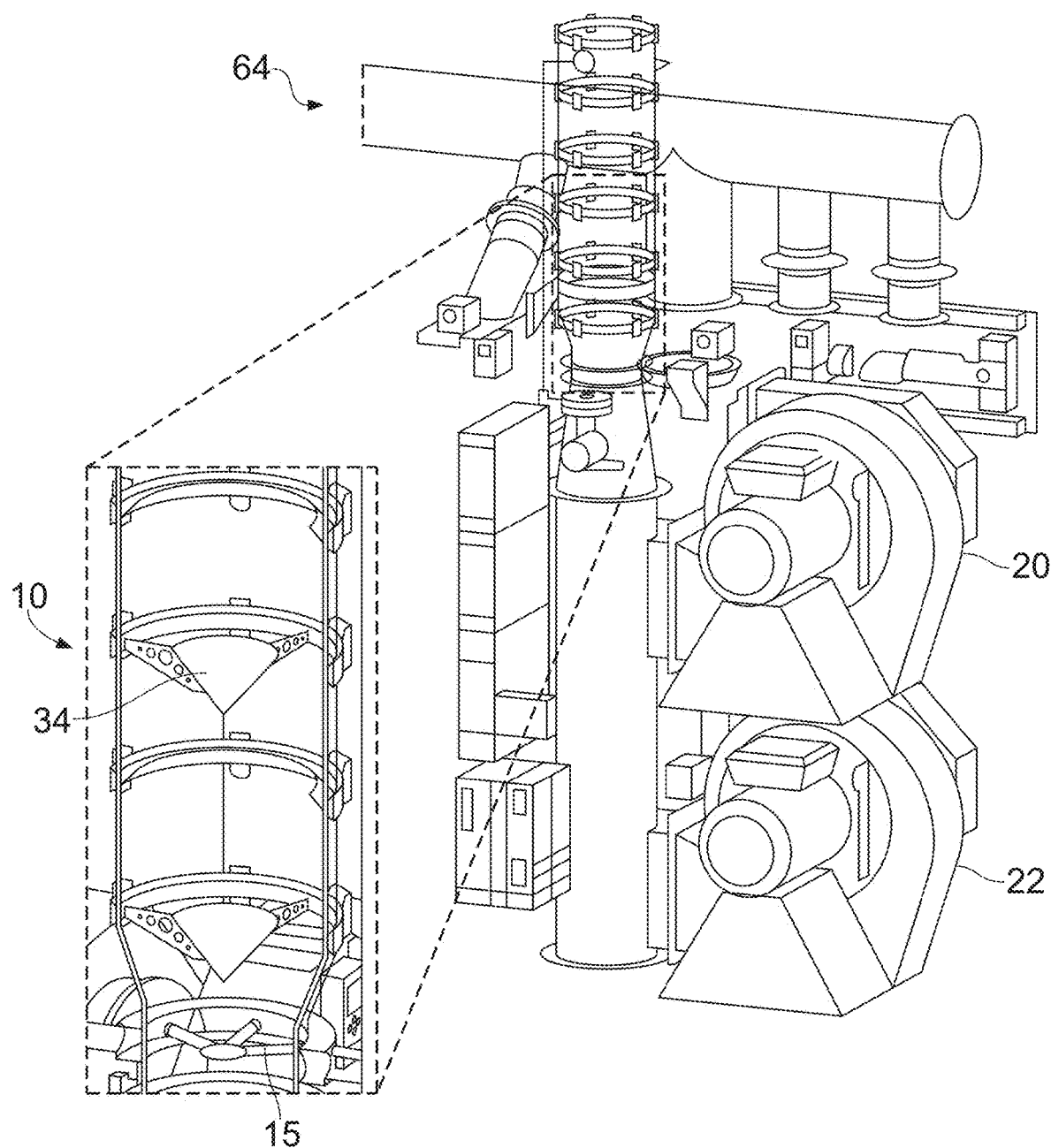
FIG. 3 shows a further view of a flammable gas diluter according to an embodiment.

FIG. 3 shows the diluter 10 arranged connected to ducts and air flow generators. The air flow generators are in the form of fans 20 and 22 and are attached to air inlets 16 and 17 (see FIG. 1) of the diluter. The fan 20 is the primary fan and fan 22 is the secondary or backup fan. Dilution vessel 10 is shown and one can see the arms from the spider and the apertures on the arms. Although these apertures appear to be facing towards the outlet, in many embodiments they will be facing towards the inlet as gas mixing and flow from these apertures is found to increase with this arrangement. The arms themselves are designed such that they do not unduly impede the air flow and yet provide a flammable gas flow at different parts of the air flow leading to improved mixing and inhibiting the generation of flumes.

In this embodiment, there is a cabinet extract pipe 64 which receives air that flows around the pumping cabinet comprising the vacuum pumps of the system and which air flow is used to inhibit flammable gasses that may leak from the pumps or their pipes collecting in the cabinet. This air flow is reused in this embodiment as the source of dilution air. This saves on additional fans for pumping this air to the roof and indeed on additional piping.

Figure 4:
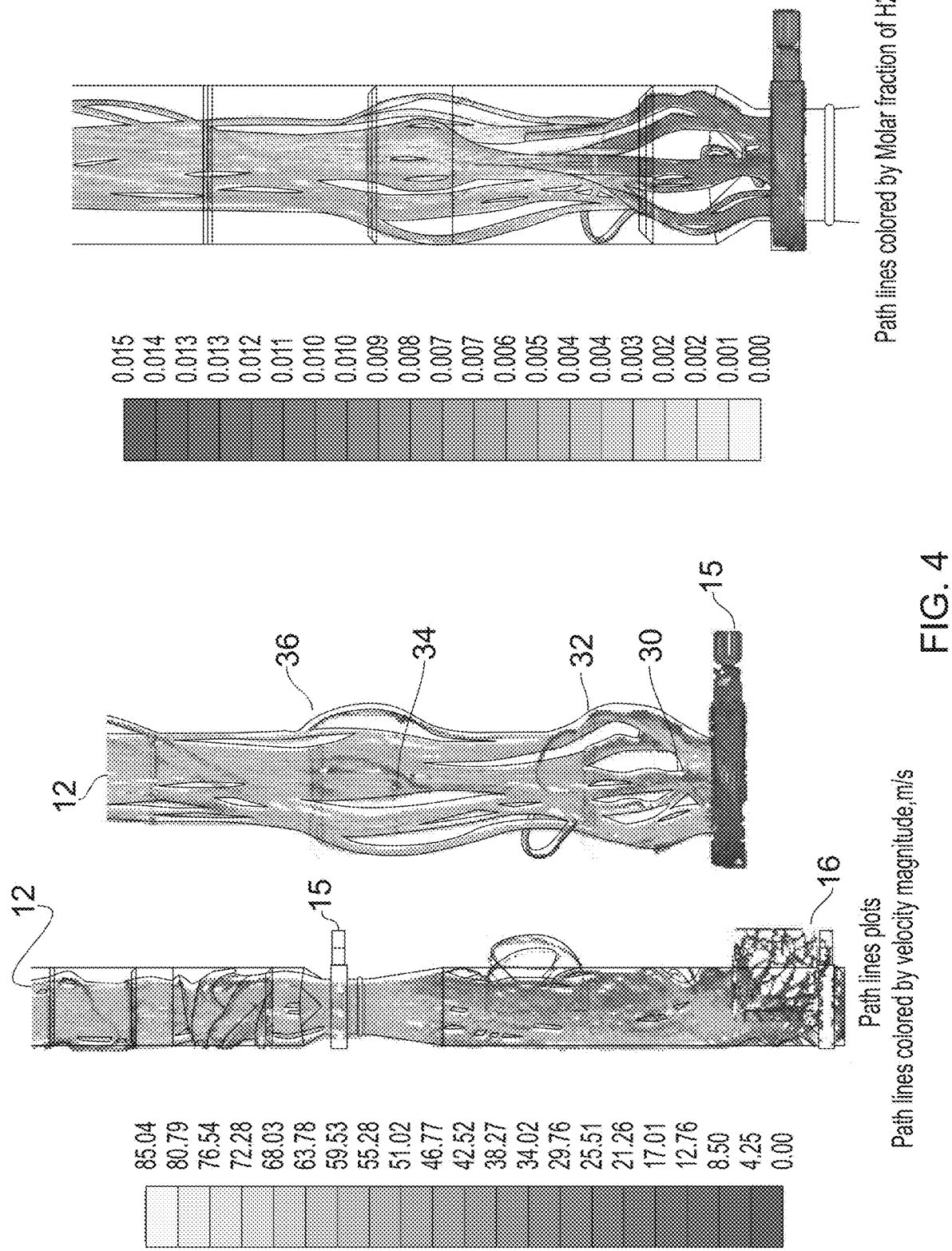
FIG. 4 schematically shows the flow paths through the dilution vessel of an embodiment.

FIG. 4 schematically shows the flow of gasses through the diluter and how the velocity of the gas flow and the concentration of hydrogen varies along the length of the diluter. The left-hand figure shows the gasses from the air inlet 16 and from the hydrogen inlet 15 and how the air flow is fast and slows at the constriction where the hydrogen is added, whereupon it accelerates again towards exhaust 12, with some slowing at each of the deflectors 30, 32, 34, 36. This improves mixing and allows mixings to occur in a relatively small volume.

The right-hand figure shows the molar fraction of hydrogen as the flow progresses through the dilution vessel and mixing occurs. Thus, it goes from a high concentration where it is above the upper flammable limit to a concentration where it is within the flammable limit and then to a concentration where it is below the flammable limit and can be safely exhausted from the vessel. In this embodiment there are 3 cones, 30, 34, 38 and after the third cone the molar concentration is about 1% thus, at the required level. As can be seen there is effective mixing of the hydrogen in the primary flow as it leaves uniformly from all the openings of the spider.

Figure 5:
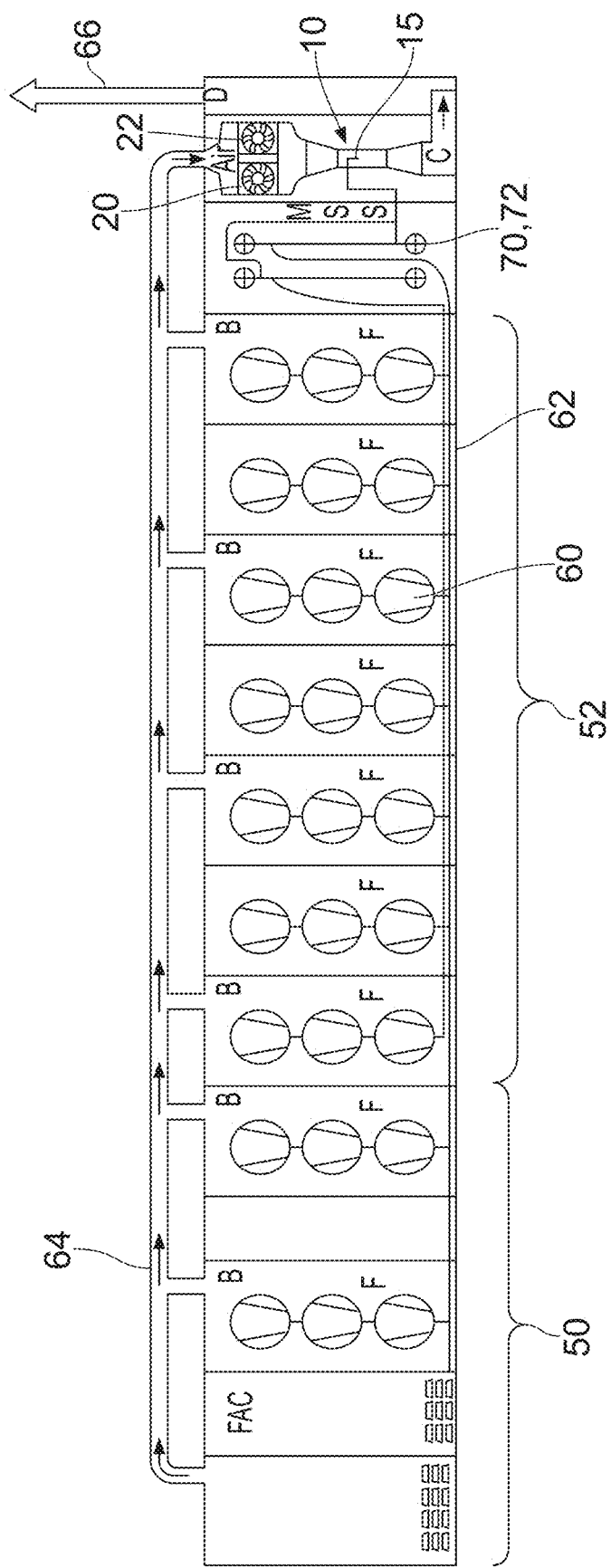
FIG. 5 shows a vacuum and abatement system according to an embodiment.

FIG. 5 shows a vacuum pumping and abatement system according to an embodiment. This embodiment is for pumping an extreme ultra-violet radiation lithography process. This arrangement comprises pumps in section 50 for pumping an exposure chamber where the wafer is exposed to the laser light and pumps in section 52 for pumping the source chamber where the extreme ultra-violet radiation is generated from lasers and a flow of tin and where hydrogen is used as a shield to protect the various optical components from tin sputtering. The generated extreme ultra-violet light is fed to the exposure chamber via a channel using optical components. Thus, the amount of hydrogen within the source chamber is significantly higher than that within the exposure chamber and it is this hydrogen that is the principal component to be diluted.

In this embodiment, there is a housing 62 which houses the multiple pumps 60 forming the pumping sections 50 and 52. There is a gas flow through this housing which is the cabinet extract flow which is used to both cool the pumps and to remove any gasses that may leak from them. In this embodiment, there is a duct 64 which channels the cabinet extract gas from the cabinet towards the gas diluter 10 of an embodiment. At the gas diluter 10 there are fans 20 and 22 which feed the air into the gas diluter vessel 10 and an inlet 15 where the hydrogen which is pumped from the foreline of the pumps which evacuate the chambers is input. This input is arranged at the restricted portion of the diluter and comprises the spider. Mixing occurs and the diluted gas is exhausted via exhaust gas flow 66. In this embodiment fans 20 and 22 are arranged side by side, thereby reducing the height of the diluter.

In this embodiment there are sensors 70 and 72 for sensing both the oxygen and the hydrogen levels within the different flows. There may also be a hydrogen sensor close to the output of the diluter 10 and these sensors can be used with control circuitry to inhibit the process if it is determined that the concentration levels of hydrogen or oxygen are such that there may be flammability problems with the gas being exhausted.

Figure 6:
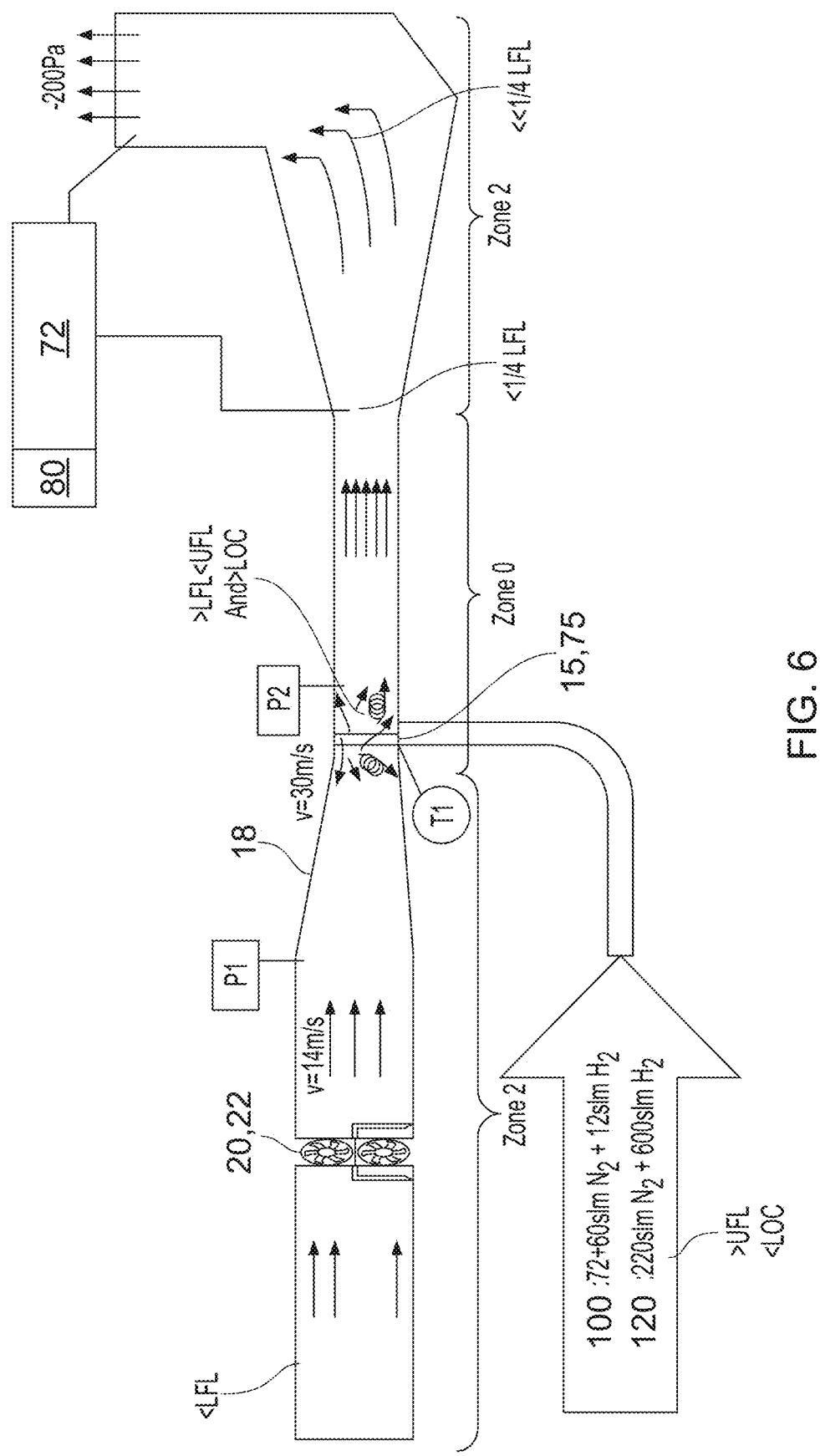
FIG. 6 shows the flow of the gases through a diluter according to an embodiment.

FIG. 6 schematically shows the different zones within the dilution system. There is the initial zone where extracted air is input through primary and backup centrifugal fans. The extracted air has very low levels of hydrogen within it and therefore is below the low flammable limit. Gas is received via a conduit from the scanner or exposure chamber 100 and the source chamber 120 with respective compositions of 132 slm (standard litres per minute) $N_2$ and 12 slm $H_2$ from the scanner chamber and 600 slm $H_2$ from the source chamber. Within the conduit the concentration of the hydrogen is above the upper flammable limit, while the oxygen levels are below the limiting oxygen concentration. The hydrogen is input via an input spider 15 and there is a flame arrester cone 75 to impede ignition of this gas flow when it meets the air. The gas flow flowing through the zone here (zone 0) is above the lower flammable limit and below the upper flammable limit and above the limiting oxygen concentration so that ignition is possible. In order to avoid ignition or at least impede it there are no moving parts within this portion of the diluter, the material of the diluter is formed of an earthed metal and the flow rate is kept above the flame speed of the flammable mixture.

As the flammable mixture flows through the dilution vessel mixing occurs due to the baffles and cones until at zone two the concentration of the flammable material has dropped to below a quarter of the lower flammable limit and the gas can now be safely vented to air. There are flammable gas sensors 72 at both the outlet and further into the dilution vessel to check that the gas mixture is substantially below the lower flammable limit. There is control circuitry 80 associated with the sensors 72 which receives signals from the sensors and is configured to activate alarms and/or close down the system in response to the lower flammable limit or a predefined fraction of the lower flammable limit being exceeded. Control circuitry 80 is also configured to control the fans, 20, 22 and dampers 16a, 17a (see FIG. 1) during startup, shut down and when fans are to be exchanged such that continuous operation can occur during such exchange.

There are primary and secondary or backup fans 20, 22 which in this embodiment are centrifugal fans with speed control able to provide a flow speed of up to 4000 $m^3$/hr. This provides a velocity of the input air of about 14 m/s which when accelerated at the construction 18 increases to above 30 m/s which is about 10 times the flame speed of hydrogen.

The distribution of the hydrogen into the air stream also prevents flashback and the cones and baffles encourage mixing of the hydrogen into the air stream such that the concentration of hydrogen is <1% v/v by the time is reaches the last baffle plate.

Figure 7:
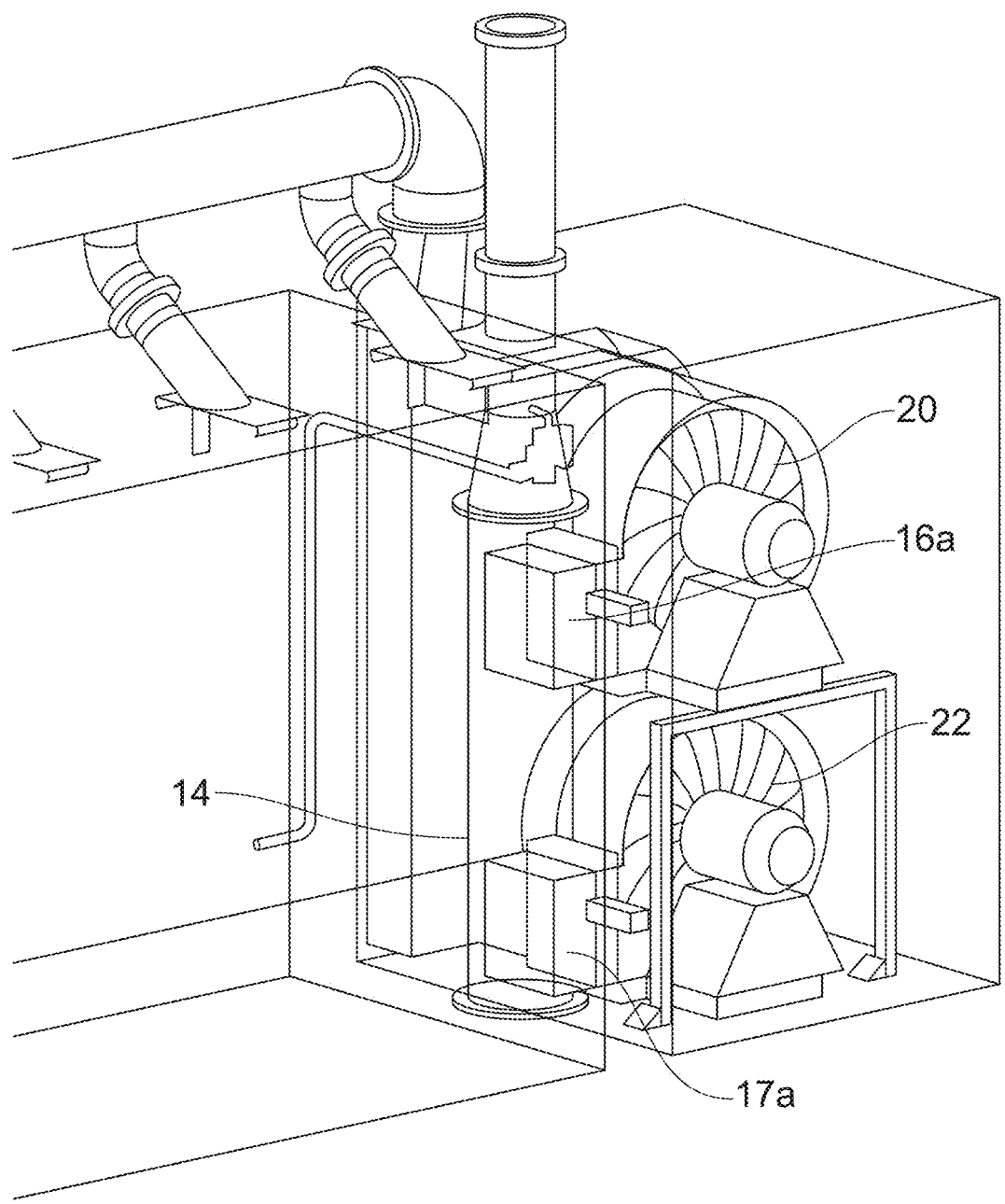
FIG. 7 shows two gas flow generators mounted one above the other adjacent to the diluter according to an embodiment.
Figure 8:
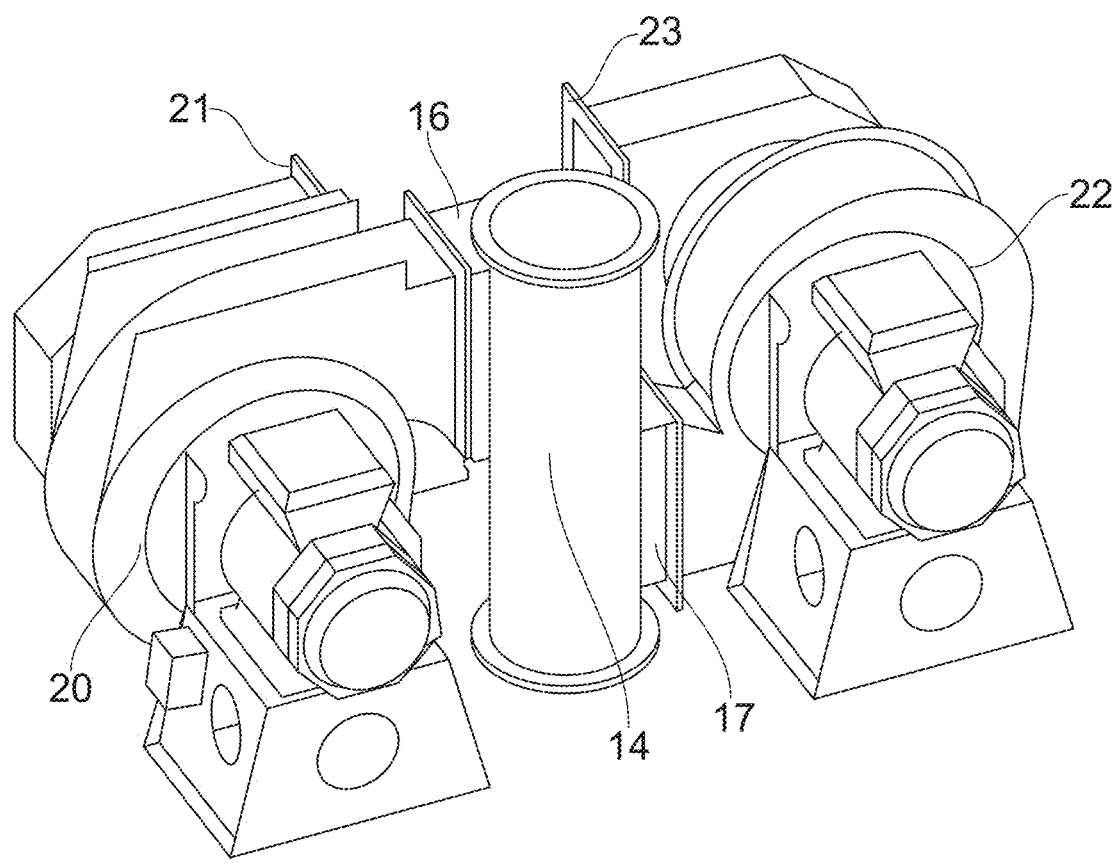
FIG. 8 shows the two gas flow generators mounted adjacent to each other on either side of the diluter according to a further embodiment.

FIG. 7 shows the fans 20, 22 with dampers 16a, 17a both shown in the closed position isolating the fans 20, 22 from air provision portion 14 of the diluter. In this embodiment the two fans are mounted one above the other FIG. 8 shows an alternative arrangement of the two fans 22, 22, here they are mounted at the same level, leading to a compact arrangement. This figure shows the air outlets of the fans providing a flow of air to the corresponding air inlets 16, 17 of the air provision portion 14 of the hydrogen diluter. The fans are mounted in different rotational orientations so that the air inlets 17 from fan 22 to the diluter is offset with respect to the air inlet 16 from fan 20 and the two apertures do not directly face each other.

Air fan inlets 21, 23 to respective fans 20, 22 are also shown. There are guillotine valves (not shown) that isolate the air fan inlets 21, 23 from the hydrogen diluter allowing the fans to be removed from the system. This arrangement although particularly compact does require careful control of the fans and dampers to inhibit air leakage through the non-operational fan which is very close to the operational fan. This is explained in more detail with respect to FIG. 10.

Figure 9:
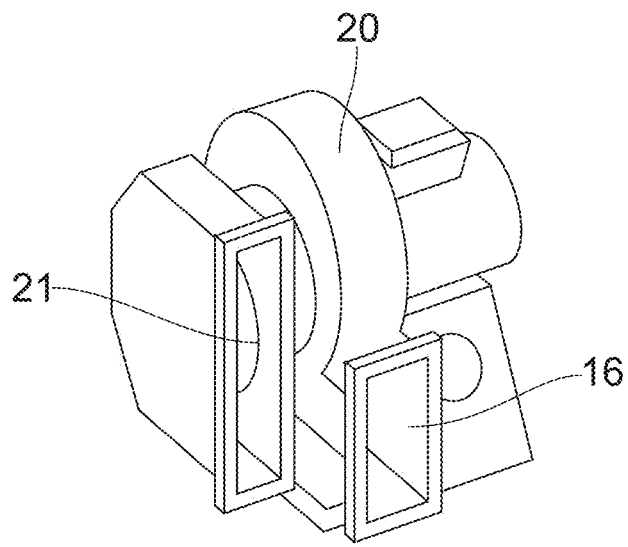
FIG. 9 shows a gas flow generator.

FIG. 9 shows fan 20, and the locations of the fan air inlet 21, and the fan air outlet or diluter air inlet 16.

Figure 10:
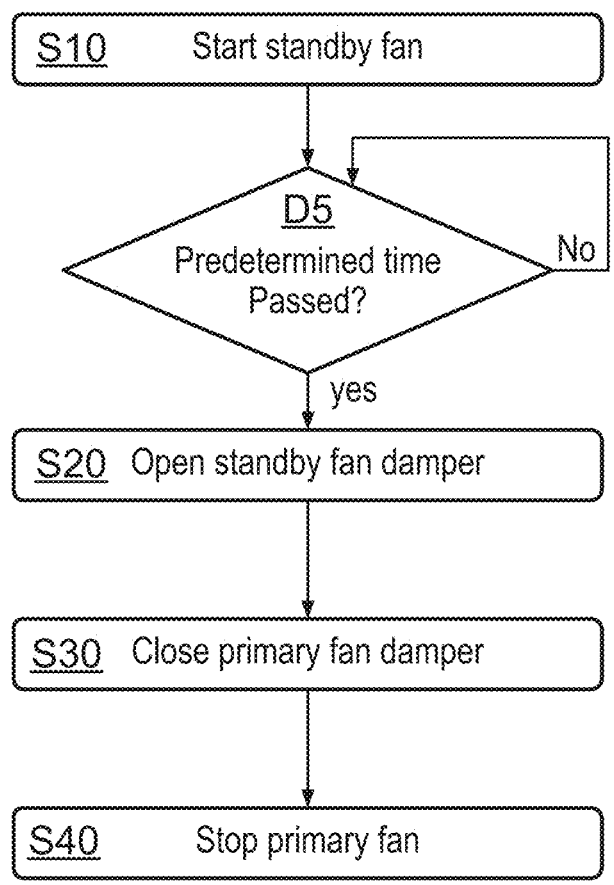
FIG. 10 shows steps in a method according to an embodiment.

FIG. 10 shows steps in a method of swapping fans according to an embodiment. Thus, when the operational fan needs replacing or servicing, the backup fan that is standby mode is started at step S10 and after a predetermined delay, when it is determined it will have reached a sufficiently high speed such that leakage backwards through the fan would be inhibited, step D5, the fan damper associated with this fan is opened at step S20. At this point the primary fan damper associated with the fan that is to serviced or replaced is closed, step S30 and this fan can then be stopped at step S40. In this way any leakage path out through a non-operational fan is inhibited by careful control of the dampers associated with the fans.

In one example, where the primary fan is working and has to be swapped, due to elevated temperature of the windings or bearings, or increased vibration then the following sequence is used to maintain the OK signal to the tool and not retract this signal which would interrupt the hydrogen flow and may cause the system to shut down.

Primary fan running with primary damper open.
Start Secondary fan wait 5 seconds (time taken from 0 rpm to default speed) then
Open secondary damper and Close primary damper
Turn off primary fan Note that a fan swap cannot now occur for at least 80 seconds due to the torque generated by the slowing fan.

If the secondary fan fails, then you must wait 80 seconds before starting the primary fan again.

Similar care must be taken at startup to avoid undue leakage of air from the dilution system.

Start Up Fan Test sequence:
When the fans do their startup test it is possible to maintain the air throughput by the following sequencing:
Open secondary damper
Start secondary fan
Timer . . . Run fan for one minute to check it works
Start Primary fan wait 5 seconds then
Open primary damper and Close secondary damper
Turn off secondary fan Note that a fan swap cannot now occur for at least 80 seconds due to the torque generated by the slowing fan.

If the primary fan fails, then you must wait 80 seconds before starting the secondary fan again.

In summary, embodiments provide a system that uses the cabinet extraction air as the dilution air, aggregates air from parallel paths by using a multiple aperture inlet spider, provides the motive force from an integral blower, and in this way provides a defined flammable zone. Critical parameters such as flammable gas concentration, air flow and temperature are monitored and interlocked to control signals, such that control of the system and/or shutdown of the system can be provided in response to these signals.

There is a second fan available to backup the primary fan. The fans can be maintained and serviced during tool operation as no $H_2$ flows through the fans.

Embodiments of the diluter provide a system which has few moving parts and uses redundancy and diversity in much of its monitoring and control system such that it is reliable and insensitive to common mode failures. In particular, there is a back up fan, the air flow comes from the cabinet extract for which flow balancing is provided across pump modules.

In some embodiments, one 4 kW inverter driven fan is sufficient to provide both cabinet extract and dilution. The second fan is in standby and preventative maintenance monitoring of the operational fan is used to detect when the standby fan needs to be brought online. In the event that any degradation in primary fan performance is detected, the secondary fan will start up and the primary fan will be isolated and stopped. The bearings and the motor can be maintained in-situ for each fan. The fan inlet and outlet are independently isolated.

In some embodiments, it takes 5 seconds for the secondary fan to run up to full speed. This is significantly more cost and power efficient than with a fueled burner where both primary and backup units run.

Furthermore, as the dilution unit is a point of use unit, there is no need to extract from systems that are not running or that are running only Scanner hydrogen flows.

In the event of a NOK signal the diluter will continue to operate and dilute.

In the event that there is a system shutdown, the pumping system removes the OK signal that shuts off the $H_2$ supply to the tool.

In the event of an unexpected stop, the residual $H_2$ will equalise within the pumping system and as the system stops some of the gas will remain in the system and some will enter the Diluter and diffuse with any air and enter the facilities exhaust. The diluter will restart followed by the pumping system and purge in the same way it does currently after an unexpected stop.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A flammable gas diluter for diluting a flow of flammable gas to a concentration below the flammability limit of said flammable gas, said diluter comprising:
   a dilution vessel comprising an outer envelope defining a longitudinal flow passage from an inlet to an outlet;
   at least one air inlet assembly for directing a flow of air into said inlet of said dilution vessel;
   a flammable gas inlet arrangement located towards an inlet end of said dilution vessel;
   two gas flow generators configured to pump a flow of air into said air inlet assembly, said two gas flow generators being located upstream of said flammable gas inlet arrangement;
wherein
   said two gas flow generators are configured to operate as operational and backup gas flow generators, and
   two dampers, one damper associated with each of said gas flow generators, each of said dampers being mounted between said corresponding gas flow generator and said dilution vessel, said dampers being configured to obscure a passage between said corresponding gas flow generator and said dilution vessel when closed and to open said passage between said gas flow generator and said dilution vessel when open; and
   control circuitry configured to control the opening and closing of said dampers, said control circuitry being configured to open said damper during an operational mode of said corresponding gas flow generator and to close said damper when said corresponding gas flow generator is stopped in standby mode.

2. The flammable gas diluter according to claim 1, said control circuitry being configured in response to a signal indicating that a currently operational gas flow generator is to be stopped and a gas flow generator currently in standby mode is to be started to:
   control said gas flow generator in standby mode to start and after a predetermined delay to:
   control said damper associated with said started gas flow generator to open.

3. The flammable gas diluter according to claim 2, wherein said predetermined delay comprises a time for said gas flow generator in standby mode to attain a rotational speed of at least 70% of a normal operational speed.

4. The flammable gas diluter according to claim 2, said control circuitry being configured to control said damper associated with said gas flow generator to be stopped to close after said predetermined delay and to control said gas flow generator to stop.

5. The flammable gas diluter according to any one preceding claim 1, said control circuitry being configured in response to a signal indicating said diluter is to startup to:
   control said damper associated with said backup gas flow generator to be open and said damper associated with said operational gas flow generator to be closed and to control said backup gas flow generator to start; and
   after a set test time to control said operational gas flow generator to start; and
   after a predetermined delay to control said damper associated with said operational gas flow generator to open and said damper associated with said backup gas flow generator to close; and
   to control said backup gas flow generator to stop operating.

6. A vacuum pumping system for evacuating at least one vacuum chamber in a semiconductor processing tool, said vacuum pumping system comprising:
- a plurality of vacuum pumps for evacuating said at least one vacuum chamber; and
- an abatement system for receiving an exhaust from at least one of said at least one vacuum chamber, wherein said abatement system comprises a flammable gas diluter according to claim 1.

7. The vacuum pumping system according to claim 6, wherein said semiconductor processing tool comprises an extreme ultraviolet lithography tool and said flammable gas comprises hydrogen.

8. The vacuum pumping system according to claim 6- or 7, further comprising a housing for housing said plurality of pumps; and
- an air flow duct for receiving air from said housing;
- said air flow duct being in fluid communication with said at least one air inlet assembly for supplying said air to said flammable gas diluter, such that air flows through said housing, along said air duct and into said diluter in response to operation of at least one of said gas flow generators.

9. A method of controlling the operation of two gas flow generators for supplying a gas flow to a flammable gas diluter according to claim 1, said method comprising
- controlling a first one of said two gas flow generators currently in standby mode to start, while keeping said damper between said first gas flow generator and said dilution vessel in a closed position;
- after a predetermined delay:
- controlling said damper associated with said first gas flow generator to open.

10. The method according to claim 9, said method further comprising: controlling said damper associated with said second gas flow generator to be stopped to close after said predetermined delay; and
- controlling said second gas flow generator to stop.

11. The method according to any claim 9- or 10, said method comprising in response to a signal indicating said diluter is to startup:
- controlling said damper associated with said backup gas flow generator to be open and said damper associated with said operational gas flow generator to be closed;
- controlling said backup gas flow generator to start; and
- after a set test time controlling said operational gas flow generator to start; and
- after a predetermined delay controlling said damper associated with said operational gas flow generator to open;
- controlling said damper associated with said backup gas flow generator to close; and
- controlling said backup gas flow generator to stop operating.

* * * * *